(12) United States Patent
Veneklasen et al.

(10) Patent No.: US 6,476,401 B1
(45) Date of Patent: Nov. 5, 2002

(54) MOVING PHOTOCATHODE WITH CONTINUOUS REGENERATION FOR IMAGE CONVERSION IN ELECTRON BEAM LITHOGRAPHY

(75) Inventors: Lee H. Veneklasen, Castro Valley; Marian Mankos, San Francisco; Bart Scholte van Mast, Pleasanton, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/397,623

(22) Filed: Sep. 16, 1999

(51) Int. Cl.[7] .................................................. G21K 5/10
(52) U.S. Cl. .................................. 250/492.24; 250/398
(58) Field of Search ........................ 250/492.24, 492.2, 250/398

(56) References Cited

U.S. PATENT DOCUMENTS

| | | | |
|---|---|---|---|
| 3,745,358 A | * 7/1973 | Firtz et al. .............. | 250/492.24 |
| 3,840,749 A | * 10/1974 | O'Keeffe et al. ....... | 250/492.24 |
| 3,887,811 A | * 6/1975 | Livesay .................. | 250/492.24 |
| 4,137,458 A | 1/1979 | King et al. ................ | 250/492 |
| 4,460,831 A | 7/1984 | Oettinger et al. ......... | 250/492.2 |
| 4,554,458 A | 11/1985 | Behringer et al. ........ | 250/492.2 |
| 4,634,343 A | * 1/1987 | Nakamats ................. | 416/3 |
| 4,652,762 A | 3/1987 | Ward ....................... | 250/492.2 |
| 4,820,927 A | 4/1989 | Langner et al. .......... | 250/492.2 |
| 4,906,894 A | 3/1990 | Miyawaki et al. ........... | 313/542 |
| 4,970,392 A | 11/1990 | Oettinger et al. ......... | 250/423 P |
| 5,023,462 A | * 6/1991 | Yamada et al. .......... | 250/492.24 |
| 5,039,862 A | 8/1991 | Smith et al. .............. | 250/432 P |
| 5,294,801 A | 3/1994 | Aton et al. .............. | 250/492.22 |
| 5,395,738 A | 3/1995 | Brandes et al. ............. | 430/296 |
| 5,654,220 A | 8/1997 | Leedy .......................... | 438/25 |
| 5,684,360 A | 11/1997 | Baum et al. ................. | 313/542 |

FOREIGN PATENT DOCUMENTS

| | | |
|---|---|---|
| EP | 0881542 A1 | 12/1998 |
| GB | 2164 787 A | 3/1986 |
| GB | 2260 666 A | 4/1993 |

OTHER PUBLICATIONS

Gordon F. Saville, et al. "Feasibility study of photocathode electron projection lithography" *J. Vax. Sci Technol. B 13(6)*. Nov./Dec. 1995, pp 2184–2188.

* cited by examiner

Primary Examiner—Bruce Anderson
(74) Attorney, Agent, or Firm—Jung-hua Kuo

(57) ABSTRACT

A moving photoconverter device that converts an incident light image into an equivalent electron or other charged particle beam image. The moving photoconverter is ring shaped and is rotated by using a motor such that the incident light image exposes a moving photoconverter surface. The photoconverter may additionally or alternatively move in an X-Y motion or radially. Continuous regeneration is provided at a site remote from the region of moving photoconverter device that converts an incident light image into an equivalent electron or other charged particle beam image.

35 Claims, 5 Drawing Sheets

MOVING PHOTOCATHODE WITH CONTINUOUS REGENERATION FOR IMAGE CONVERSION IN ELECTRON BEAM LITHOGRAPHY

BACKGROUND

1. Field of the Invention

This invention relates to charged particle beam columns, and more specifically to a system for generating charged particle beams from a light image.

2. Description of The Related Art

In the field of electron beam (or charged particle beam) lithography, a beam of, e.g., electrons from an electron source is directed onto a substrate. The electrons expose a resist layer (in this case an electron sensitive resist) on the substrate surface. Typically electron beam lithography is used for making masks; however it can also be used for direct exposure of semiconductor wafers.

One technique to generate an electron beam image is to expose a photocathode with a light image, whereby the photocathode converts the light image into a demagnified electron beam image. One problem with the use of a photocathode is variations in the photon-to-electron conversion ratio of the photocathode, which in turn cause dose errors in a charged particle image written on the mask or wafer. Hereafter "electron conversion factor" means photon-to-electron conversion ratio of the photocathode. Such variations are due, for example, to particulate contamination, chemical contamination, and overexposure of a local area of the photocathode.

Thus what is needed is a method and apparatus to generate charged particle beam images using a photocathode with reduced variations in the electron conversion factor.

SUMMARY

One embodiment of the present invention provides a beam conversion system that includes: a photoconverter on which is incident a light image, that converts the light image into a charged particle beam; and a displacement device coupled to move the photoconverter, where the light image illuminates a moving surface of the photoconverter.

Thereby an embodiment of the present invention provides a method of generating a light image, the method including the acts of: generating a light image; directing the image onto a moving photoconverter, whereby the image is incident on a moving surface of the photoconverter device; and converting, at the photoconverter device, the image into an electron emission pattern which is imaged on the surface of a mask or wafer.

Various embodiments of the present invention will be more fully understood in light of the following detailed description taken together with the accompanying drawings.

BRIEF DESCRIPTION OF DRAWINGS

Note that use of the same reference numbers in different figures indicates the same or like elements.

DETAILED DESCRIPTION

System Overview

Figure 1:
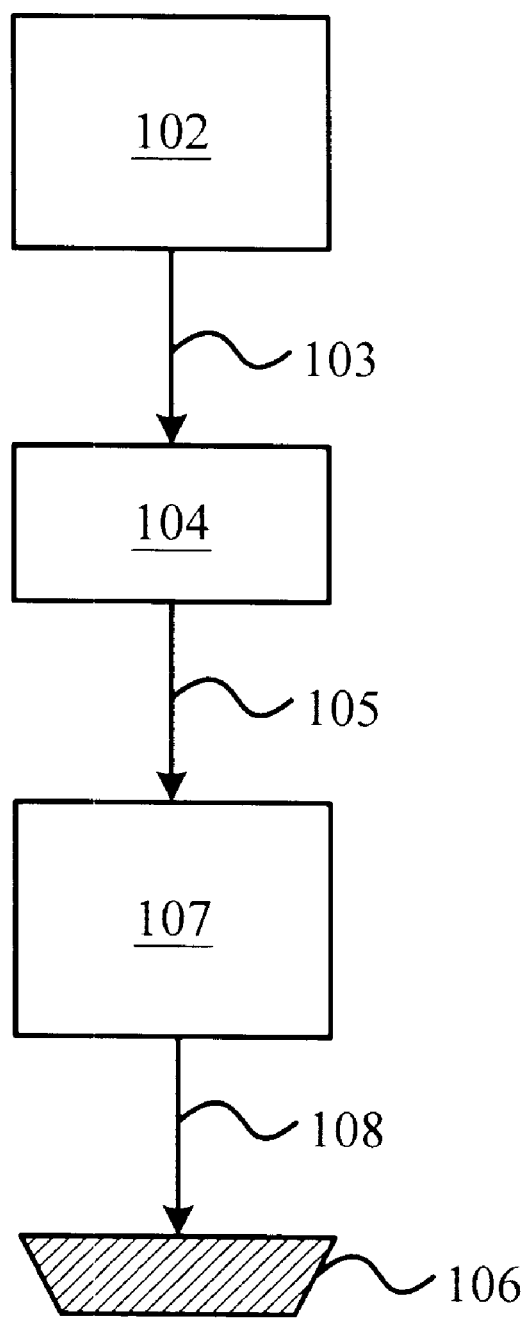
FIG. 1 depicts schematically an electron beam lithography system 100 in accordance with one embodiment of the present invention.

FIG. 1 depicts schematically an electron beam lithography system 100 in accordance with one embodiment of the present invention. System 100 includes a light illumination system 102 and a photoconverter system 104. Light illumination system 102 outputs a light image 103 by, for example, exposing an optical mask with light. In accordance with one embodiment of the present invention, photoconverter system 104 converts the light image 103 into an electron emission pattern 105, whose demagnified image 108 is projected onto substrate 106 by electron optical system 107.

Suitable Illumination System 102

A suitable illumination system 102 is any device that generates a light image. For example, a suitable conventional illumination system includes an illumination source that exposes an image defining mask and a lens that focuses the defined image onto the photoconverter system 104.

Another suitable illumination system 102 is a laser system, i.e., a photolithographic device which creates one or more focused and modulated laser beams. One such laser system is described in U.S. Pat. Application Ser. No. 08/769,169, entitled "Short Wavelength Pulsed Laser Scanner", inventors Paul C. Allen et al., filed Dec. 18, 1996, attorney docket no. M-4485 US; and U.S. Pat. Nos. 5,255,051, issued Oct. 19, 1993, to Paul C. Allen, 5,327,338, issued Jul. 5, 1994, to Paul Allen, et al., and 5,386,221, issued Jan. 31, 1995, to Paul C. Allen, et al., all incorporated herein by reference in their entirety.

Photoconverter System 104

Figure 2:
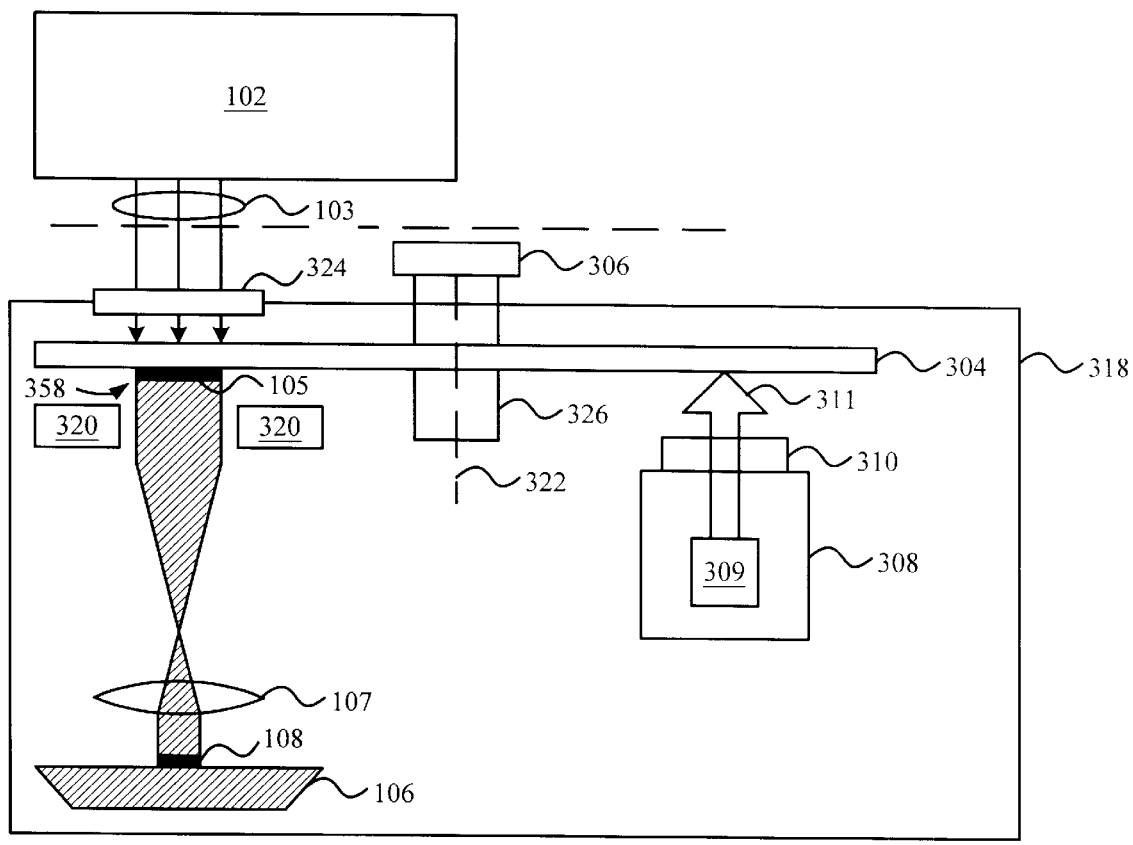
FIG. 2 depicts in side view, one embodiment of photoconverter system 104, as well as electron optics system 107, and a substrate 106.

In accordance with one embodiment of the present invention, FIG. 2 depicts in side view, one embodiment of photoconverter system 104, as well as electron optics system 107, and a substrate 106. Photoconverter system 104 includes a photocathode 304 that converts light image 103 into electron emission pattern 105; a motor 306 that revolves photocathode 304; extraction electrode 320; and a regeneration source 308 that regenerates a portion of photocathode 304. Electron optics system 107 projects a demagnified image 108 of emission pattern 105 onto substrate 106.

In this embodiment, a vacuum casing 318 encloses photoconverter system 104, electron optics system 107, and substrate 106. A conventional vacuum pump device (not depicted) controls the pressure within the vacuum casing 318. The vacuum casing 318 includes a transparent window 324 that is aligned coaxial with light image 103 and allows light image 103 to expose photocathode 304.

Figure 3:
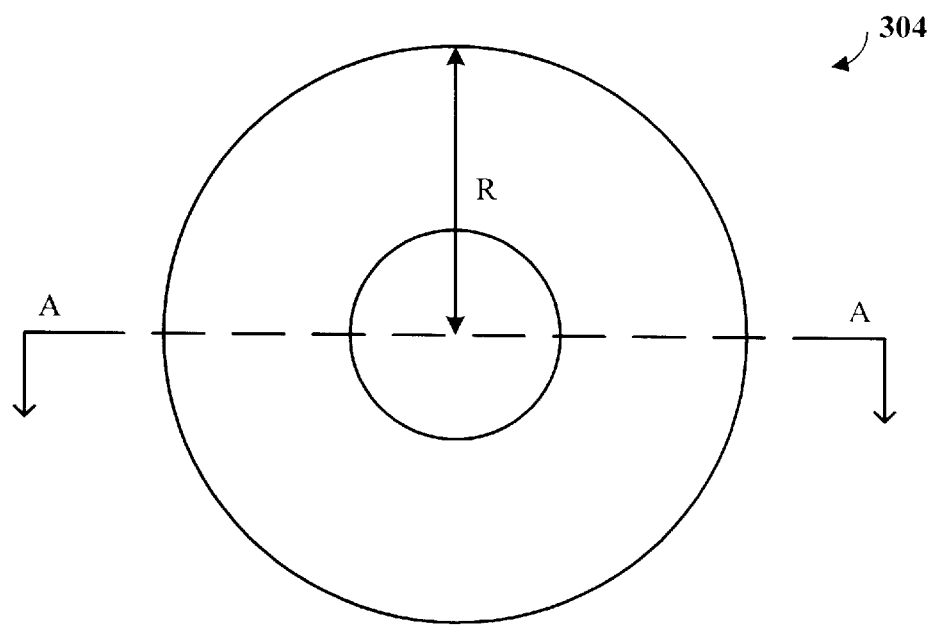
FIG. 3 depicts a ring shaped photocathode 304 in accordance with one embodiment of the present invention.
Figure 4:
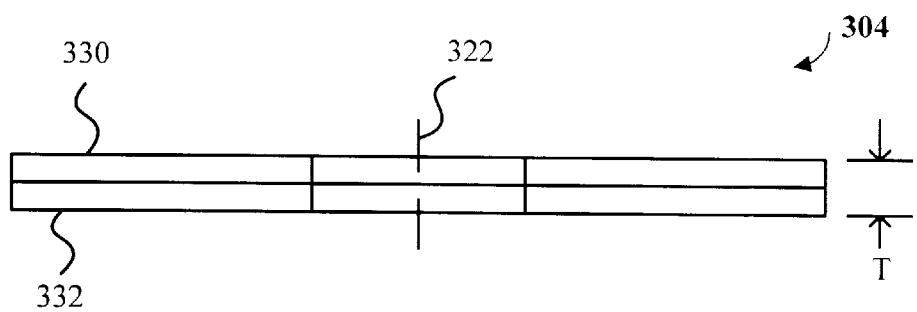
FIG. 4 depicts a cross sectional view of a photocathode 304 of FIG. 3 along line A—A in accordance with one embodiment of the present invention.

FIG. 3 depicts a ring shaped photocathode 304 in accordance with this embodiment. A suitable radius R of photocathode 304 is approximately 3 to 5.5 cm. FIG. 4 depicts a cross sectional view of a photocathode 304 along line A—A of FIG. 3. Photocathode 304 includes a conventional substrate layer 330, being a transparent material such as, e.g., sapphire or quartz, on a photoemission layer 332 being, e.g., gold, tin oxide, or cesium iodide (CsI). A suitable thickness T of photocathode 304 is approximately 1 mm to 5 mm.

Referring to FIG. 2, photocathode 304 absorbs the photons of incident image 103 from light illumination system 102 and thereby causes electrons present in the photoemission layer 332 to be excited above the vacuum level. Electrons which gain sufficient energy to escape from the surface of photoemission layer 332 are emitted in the -Z direction from the photoemission layer 332. With respect to photoconverter system 104, the term "downstream" means along the (-)Z direction from photocathode 304.

Extraction electrode 320 is positioned in the -Z direction from photocathode 304, and coaxial with the path of beam 103. In other embodiments, a conventional field lens could be used in conjunction with extraction electrode 310. Hereafter the term "extraction device" refers to extraction electrode 320 with or without a field lens unless otherwise specified. A suitable implementation of the extraction device is described in U.S. patent application Ser. No. 09/272,086, entitled "Compact Photoemission Source, Field And Objective Lens Arrangement For High Throughput Electron Beam Lithography", filed Mar. 18, 1999, inventors Veneklasen and Mankos, now U.S. Pat. No. 6,315,128, which is incorporated by reference in its entirety.

When a voltage (typically tens of kilovolts) is applied to the extraction device, the extraction device extracts the electrons which have escaped from the photoemission layer of photocathode 304 and accelerates them to generate electron image 108 of the emission pattern 105 on the photocathode.

In this embodiment, photocathode 304 is mounted to a rotating spindle 326 driven by motor 306, located within the vacuum casing 318 of photoconverter system 104. Motor 306 rotates ring-shaped photocathode 304 about axis 322, so that incident light image 103 exposes a ring-shaped area of the rotating photocathode 304.

In one embodiment, motor 306 is located outside of the vacuum casing 318 of photoconverter 104. Spindle 326 of motor 306 is divided into two portions. A portion of spindle 326 is external to the vacuum casing 318 ("external portion") and directly coupled to motor 306 and a portion of spindle 326 is inside the vacuum casing (not shown) ("internal portion") The external and internal portions are separated by a non-magnetic thin membrane being, e.g., stainless steel foil. The external and internal portions are coupled by a permanent magnet so that they rotate at the same rate. Thereby, motor 306, located outside of the vacuum casing, rotates the photocathode 304.

The purpose of rotating photocathode 304 is to average variations in the level of electron emissions from photocathode 304. Such variations are due, e.g., to local defects on the photoemission layer 332 such as particulate or chemical contamination and overexposure of a local area. Such defects cause variations in the electron conversion factor of the photocathode 304, which in turn cause dose errors in an electron image 108 written on the substrate 106. When the rotating photocathode is illuminated by light image 103 to generate a single pixel imaged on the substrate 106 (hereafter image pixel), the effective electron conversion factor to generate the image pixel is the average of the electron conversion factors of the pixel areas of the photocathode illuminated by light image 103 during exposure of the pixel.

The photocathode 304 should move fast enough so that each image pixel on the substrate receives its exposure from many corresponding pixel areas on the photocathode 304, where a pixel area on the photocathode 304 is the larger than an image pixel by, e.g., the square of the demagnification factor of the electron optics system 107. A typical range of a demagnification factor of the electron optics system 107 is 3 to 10 times.

For example, if photocathode 304 moves at linear speed of 5 cm/s and a pixel on the photocathode 304 is exposed for a duration of 5 ms, then the photocathode has moved 0.025 cm. If the size of an image pixel on the photocathode is 1 $\mu$m and is demagnified 10 times to expose a 0.1 $\mu$m size pixel on the substrate 106, 250 corresponding pixel areas on photocathode 304 are used to expose each image pixel.

Conventional regeneration source 308 (FIG. 2) is located in the -Z direction from photocathode 304, but is offset from the path of image 103, but interior to the outer edge of photocathode 304. The region coaxial and immediately downstream of emission pattern 105 becomes available to include additional componentry such as extraction electrode 320 and does not have to accommodate a regeneration source. The length of the photoconverter system 104 can be reduced, thereby reducing electron-electron interactions which can cause blurring of the electron image 108.

Regeneration source 308 continuously or periodically regenerates a portion of photoemission layer 332 of photocathode 304. Regenerating the photocathode stabilizes the photocathode's "electron conversion factor" at an optimum value. In this embodiment, regeneration source 308 regenerates a part of the photoemission layer 332 by, e.g., sputtering; depositing of additional photoemission layer material; molecular beam epitaxial deposition; ion beam deposition; condensation from gas; exposure to gas; exposure to a molecular beam; or plasma exposure. A suitable implementation of regeneration source 308 is a source 309 that outputs molecules 311 of, for example, Cesium. In one embodiment, regeneration source 308 includes a nozzle 310 that controls the shape of the area exposed by the regeneration source 308.

In one embodiment, an electron optical lens system 107, shown schematically in FIG. 2, is used to demagnify the emission pattern 105 and focus the demagnified emission pattern 105 to an image 108 on the substrate 106. In this embodiment, the electron optical lens system 107 is positioned in the -Z direction from the photocathode 304 and coaxial with emission pattern 105. In this embodiment, electron optical lens system 107 and the substrate 106 are located within vacuum casing 318.

In another embodiment, electron optical lens system 107 is positioned within the vacuum casing while the substrate 106 is positioned within a separately pumped vacuum casing. A suitable implementation of electron optical lens system 107 is described in U.S. patent application Ser. No. 09/272,086, filed Mar. 18, 1999, entitled "Compact Photoemission Source, Field And Objective Lens Arrangement For High Throughput Electron Beam Lithography".

Figure 5:
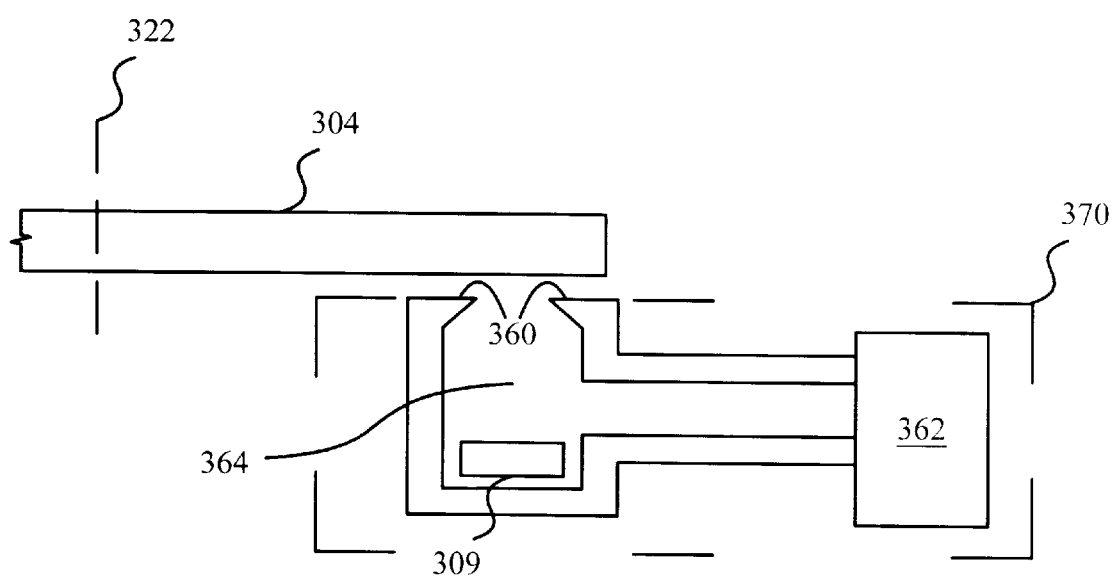
FIG. 5 depicts schematically a differentially pumped regeneration source 370, used in place of regeneration source 308, in one embodiment.

FIG. 5 depicts schematically a differentially pumped regeneration source 370, used in place of regeneration source 308. In this embodiment, there is a small gap between the regeneration source nozzle 360 and photocathode 304. Another conventional vacuum pumping device 362 is coupled to pump the regeneration region 364. This differential pumping arrangement allows the pressure in the regeneration region 364 to be higher than that in region 358; within vacuum casing 318 (FIG. 2), in which the electron emission pattern 105 is formed. This is desirable when byproducts of the regeneration source 370, e.g., water and gas, are undesirable on the rest of the photocathode surface 304. For example, regeneration source 370 is used where plasma deposition or condensation are applied. In this embodiment a suitable pressure in regeneration region 364 and region 358 are respective $1\times10^{-8}$ Torr and $1\times10^{-10}$ Torr.

Figure 6:
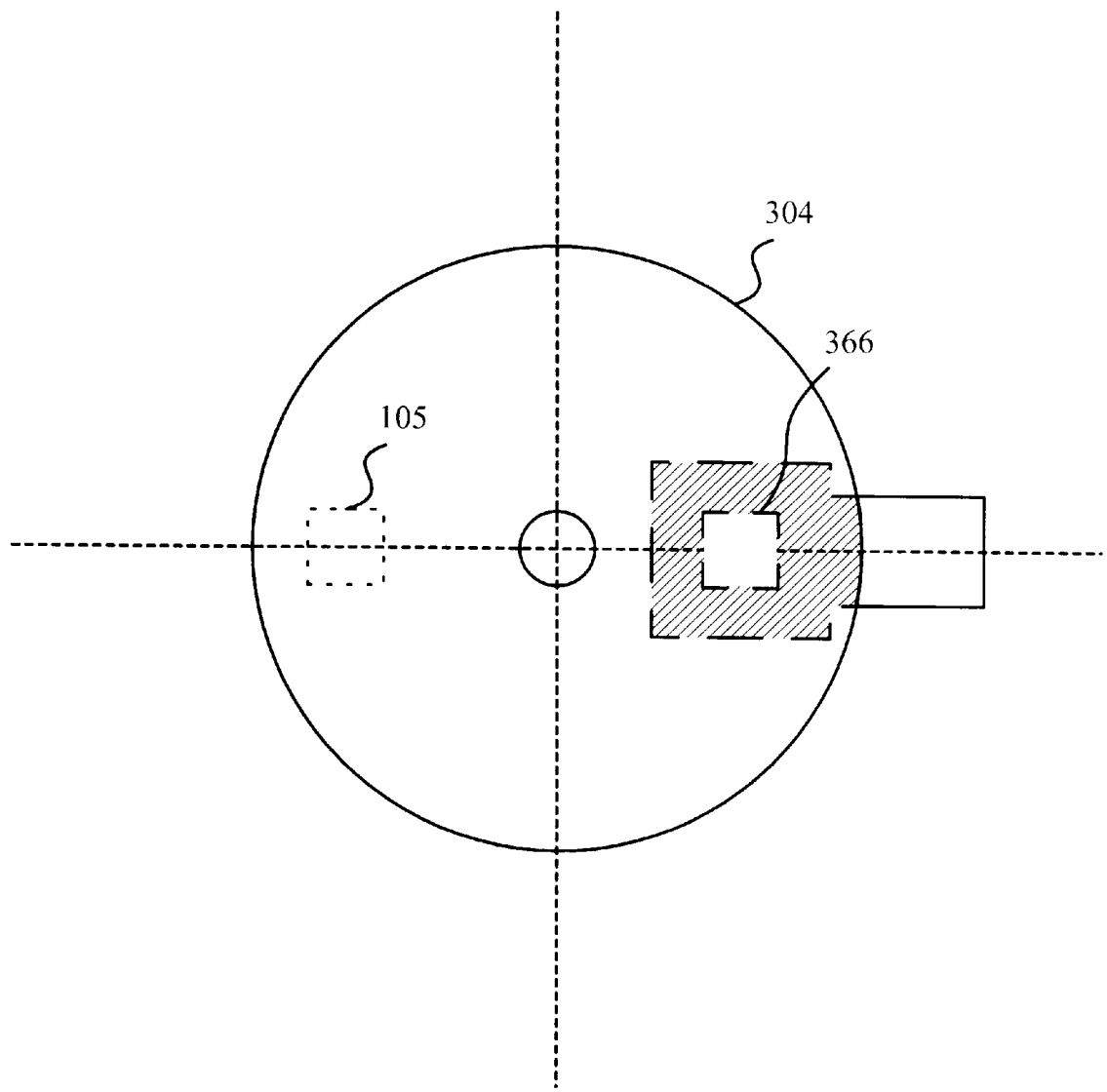
FIG. 6 depicts a relationship between a top side view of photocathode 304 and the opening of nozzle 360.

In one embodiment, the opening of nozzle 360 is trapezoid shaped to compensate for unequal exposure dose of the photocathode due to differing linear velocities along increasing radii from the axis of rotation. FIG. 6 depicts a top side view of photocathode 304 (from the -Z direction in FIG. 2), the trapezoid shaped opening 366 of nozzle 360, and emission pattern 105.

When photocathode 304 moves, it is possible to regenerate photocathode 304 while simultaneously using another segment of photocathode 304 to convert incident light into an electron beam. Thereby, by both moving photocathode 304 and regenerating the photocathode;, the photocathode's "electron conversion factor" is continuously stabilized at an optimum value and the photocathode's electron conversion factor is averaged.

In one embodiment, photocathode 304 is simultaneously rotated and rotating spindle 326 moved within the plane of photocathode 304 so that photocathode 304 moves radially to and from the beam axis and incident image 103 exposes regions at varying radii from the center of photocathode 304. This allows emission to be averaged over a larger area, providing a longer cathode life.

In one embodiment, photocathode 304 is moved in an X-Y direction, within the plane of the photocathode 304, by for example a conventional X-Y stage.

Thus by use of a displacement device such as motor 306 or a conventional stage, photocathode 304 is moved while illuminated.

The above-described embodiments are illustrative and not limiting. It will thus be obvious to those skilled in the art that various changes and modifications may be made without departing from this invention in its broader aspects. Therefore, the appended claims encompass all such changes and modifications as fall within the scope of this invention.

What is claimed is:

1. A beam conversion system comprising:

a photoconverter on which is incident a light image, thereby to convert the light image into a charged particle emission pattern;

an electron optical system that demagnifies and focuses the emission pattern onto a resist coated substrate; and a displacement device comprising a motor, the displacement device being coupled to rotate the photoconverter, wherein the light image illuminates a rotating surface of the photoconverter.

2. The system of claim 1 wherein the photoconverter comprises a photocathode.

3. The system of claim 2, further comprising:

a stage that moves the axis of the rotating photoconverter within the plane of the photoconverter.

4. The system of claim 2 wherein the motor is magnetically coupled to the photoconverter.

5. The system of claim 4 wherein the photoconverter is encased in a vacuum casing and wherein the motor is positioned outside of the vacuum casing and wherein the motor is magnetically coupled to the photoconverter.

6. The system of claim 1, wherein the displacement device comprises:

a stage that moves the photoconverter in an X-Y direction and within the plane of the photoconverter.

7. The system of claim 1 further comprising:

a regeneration source positioned to continuously regenerate a portion of the photoconverter while another portion is being used to convert an image.

8. The system of claim 7 wherein the regeneration source sputters material onto the photoconverter.

9. The system of claim 7 wherein the regeneration source deposits material onto the photoconverter by molecular beam epitaxial deposition.

10. The system of claim 7 wherein the regeneration source exposes the photoconverter to a molecular beam.

11. The system of claim 7 wherein the regeneration source deposits material onto the photoconverter by ion beam deposition.

12. The system of claim 7 wherein the regeneration source deposits material onto the photoconverter by condensation from a gas.

13. The system of claim 7 wherein the regeneration source comprises:

a regeneration chamber a regeneration source positioned within the regeneration chamber, wherein the regeneration source provides regenerative material;

a pump that controls the pressure in the regeneration chamber; and a nozzle opening, spaced apart from the photoconverter, wherein the nozzle controls the direction and shape of material emitted to the photoconverter.

14. The system of claim 13 wherein the pressure within the regeneration chamber is higher than the pressure in a region proximate the photoconverter in which the light image is converted into the emission pattern.

15. The system of claim 13 wherein the nozzle opening is shaped to provide uniform regeneration of the photoconverter.

16. The system of claim 13 wherein the nozzle opening is trapezoid shaped.

17. The system of claim 7 wherein the regeneration source continuously regenerates a portion of the photoconverter while another portion of the photoconverter converts the light image into an emission pattern.

18. The system of claim 1, wherein the movement of the photoconverter by the displacement device is rotation about an axis of the photoconverter.

19. The system of claim 1, wherein the photoconverter is ring-shaped.

20. The system of claim 1, wherein the motor rotates the photoconverter about an axis, the motor being coaxial to the axis.

21. A method of generating a charged particle beam image from a light optical image, the method comprising the acts of:

generating a light image;

providing a motor to rotate a photoconverter;

directing the image onto the photoconverter whereby the image is incident on a rotating surface of the photoconverter;

converting, at the photoconverter, the image into a charged particle emission pattern;

demagnifying the emission pattern; and focusing the demagnified emission pattern onto a substrate.

22. The method of claim 21 wherein the photoconverter comprises a photocathode.

23. The method of claim 20, further comprising the act of regenerating a portion of the photoconverter.

24. The method of claim 23 wherein the act of regenerating comprises the act of sputtering.

25. The method of claim 23 wherein the act of regenerating comprises the act of molecular beam deposition.

26. The method of claim 23 wherein the act of regenerating comprises the act of exposing the photoconverter to a molecular beam epitaxy.

27. The method of claim 23 wherein the act of regenerating comprises the act of ion beam deposition.

28. The method of claim 23 wherein the act of regenerating comprises the act of providing condensation from gas.

29. The method of claim 23 wherein the act of regenerating comprises removing undesired material.

30. The method of claim 23 wherein the act of regenerating comprises the act of using a nozzle opening shaped to provide uniform exposure to the photoconverter.

31. The method of claim 21, wherein the photoconverter device continuously moves.

32. The method of claim 21, wherein the movement of the photoconverter is rotation.

33. The method of claim 21, wherein the photoconverter is ring-shaped.

34. The method of claim 21, wherein the rotation of the photoconverter is about an axis, and wherein the motor is coaxial to the axis to rotate the photoconverter about the axis.

35. A method of generating a charged particle pattern, comprising the steps of:
   generating a light image;
   providing a photoconverter;
   providing a motor to rotate the photoconverter;
   rotating the photoconverter relative to an axis of the light image;
   directing the light image onto the rotating photoconverter, whereby the image is incident on a rotating surface of the photoconverter;
   converting, at the photoconverter, the light image into a charged particle pattern;
   demagnifying the charged particle pattern; and
   focusing the demagnified charged particle pattern onto a target.

* * * * *